US 6,599,862 B2
Jul. 29, 2003

(54) METHOD FOR PREPARING BISMUTH-BASED HIGH TEMPERATURE SUPERCONDUCTORS

(75) Inventors: Sergey Lee, Tokyo (JP); Setsuko Tajima, Tokyo (JP)

(73) Assignees: Superconductivity Research Laboratory, Tokyo (JP); International Superconductivity Technology Center

(*) Notice: Subject to any disclaimer, the term of this patent is extended or adjusted under 35 U.S.C. 154(b) by 0 days.

(21) Appl. No.: 09/916,175

(22) Filed: Jul. 26, 2001

(65) Prior Publication Data

US 2002/0022577 A1 Feb. 21, 2002

(30) Foreign Application Priority Data

Jul. 27, 2000 (JP) .......................... 2000-231379

(51) Int. Cl.[7] .................. C04B 101/00; C04B 35/64
(52) U.S. Cl. .................. 505/501; 505/737; 505/742
(58) Field of Search .................. 505/501, 737, 505/742

(56) References Cited

U.S. PATENT DOCUMENTS 5,039,653 A * 8/1991 Jackson et al. ............. 505/1
5,096,879 A * 3/1992 Arendt ...................... 505/1

OTHER PUBLICATIONS

Osipov et al "Single Crystals of 2223 Phase . . . ", Solid State Comm., 97(5), 377–380. 1996.*
Prabhakaran et al "Synthesis of Bi–2223 Phase using different precursors . . . ", Materials Science and Engineering, B58(1999), 199–205.*
Balestrino et al "Fast Growth of Bi2Sr2Ca2CU3O10 and Bi2Sr2CaCu2O8 thin crystals . . . ", Appl. Phys. Lett., 64(13), 1725–37, 1994.*
Mandal et al "Resistivity anisotropy in the Y–substituted Bi–2212 system" Physica C 216(1993), 195–198.*
Arendt et al "Flux–assisted Preparation of Powdered Bismuth Superconductors", Mat. Res. Symp. Proc. vol. 169, 1990, 397–400.*
Chu et al "growth and characterization of (Bi, Pb)2Sr2Ca2Cu3Ox single crystals", Journal Materials res. 13(3), 1998, 589–95.*

* cited by examiner

Primary Examiner—Mark Kopec
(74) Attorney, Agent, or Firm—Flynn, Thiel, Boutell & Tanis, P.C.

(57) ABSTRACT

The invention provides a method for stably preparing a bismuth-based high temperature superconductor of a Bi-2223 single-phase or a Bi/Pb-2223 single phase, wherein a second phase is not allowed to reside, at a low cost and efficiently. With the method described above, mixed powders of raw materials (mixed powders of oxides and carbonates), obtained by mixing the raw materials such that a mixing ratio of constituents, Bi:Sr:Ca:Cu or (Bi,Pb):Sr:Ca:Cu, becomes identical to the stoichiometric ratio of a crystal of the superconductor $Bi_2Sr_2Ca_2Cu_3O_z$, or $(Bi,Pb)_2Sr_2Ca_2Cu_3O_z$, respectively, are used as raw material for sintering, and the sintering is applied thereto, using KCl as a flux. In this case, the raw material for the sintering as calcinated is preferably used, and the sintering is preferably applied at a sintering temperature kept at a constant level.

7 Claims, 5 Drawing Sheets

X-ray powder diffraction patterns for the Bi-2223 samples with nominal compositions $Bi_{1.68}Pb_{0.32}Sr_{1.75}Ca_{1.85}Cu_{2.85}B_x$-$O_y$ ($x = 0, 0.01$), and $Bi_2Sr_{1.6}Ca_{2.4}Cu_3O_{10}$.

METHOD FOR PREPARING BISMUTH-BASED HIGH TEMPERATURE SUPERCONDUCTORS

BACKGROUND OF THE INVENTION

1. Field of the Invention

The present invention relates to a method of preparing a bismuth-based high temperature superconductor suitable for preparing a raw material for a high temperature superconducting wire or for forming high temperature superconducting films such as a superconductor device made up of stacked superconductor films.

2. Description of the Related Art

There have recently been discovered various oxide-based high temperature superconductors one after another, and there have since been seen vigorous activities to develop techniques for fabricating wires or superconductor devices from these materials, which have a poor plastic workability. For example, with reference to fabrication of wires, techniques for using a yttrium-based high temperature superconductor and a bismuth-based high temperature superconductor have recently come to be in the mainstream of R and D efforts.

Among these materials, the bismuth-based high temperature superconductor is receiving a lot of attention as a material quite advantageous in the fabrication of wires because this superconductor tends to undergo crystal growth oriented in a direction in which electric current can flow with ease, and has a crystal structure wherein flake-like substances are bonded with each other in a direction of thickness.

The reason for this is as follows. For the fabrication of wires from high temperature superconductors, there has usually been adopted a method of filling superconductor powders as adjusted into a silver tube, and applying thereto plastic working such as drawing, rolling, and so forth, thereby fabricating long products. Accordingly, the bismuth-based high temperature superconductor having the properties as described above has advantages in that its crystals tend to be oriented in a direction in which electric current can flow with ease when subjected to compression working in the axial direction by rolling, and so forth, and further, the powders thereof tend to be closely packed with ease.

However, there has been pointed out a problem with the bismuth-based high temperature superconductors having high temperature superconductivity such as $Bi_2Sr_2Ca_2Cu_3O_z$ (hereinafter referred to as Bi-2223), and $(Bi, Pb)_2 Sr_2Ca_2CU_3O_z$ (hereinafter referred to as Bi/Pb-2223) in that these superconductors has a drawback of poor manufacturability, and tends to generate substances showing non-superconductivity (non-superconductive phase) during a manufacturing process even though the crystals of these superconductors can be oriented with greater ease when subjected to plastic working as compared with the case of the yttrium-based high temperature superconductor.

That is, With reference to the Bi-2223, various methods have been tried such as a method of sintering (a sintering temperature: on the order of 890° C.) a starting material composed of powders of raw materials mixed at a composition ratio (a non-stoichiometric ratio) deviating from the stoichiometric ratio on purpose in order to increase the amount of Bi-2223 generated because a Bi-2223 phase is hardly obtainable by mixing of raw materials according to the stoichiometric ratio, and a method of devising process conditions such as changing of the partial pressure of oxygen during sintering (refer to, for example, "Solid State Commun., 110 (1999), p. 287, and "Supercond. Sci. Technol.", 11 (1998), p. 288). However, with either of the above-described methods according to the "solid-state reaction process", there has not occurred sufficient progress in the final reaction to arrive at the Bi-2223 phase from $Bi_2Sr_2CaCu_2O_z$ (hereinafter referred to as Bi-2212), which is an intermediate product phase, thereby failing to succeed in obtaining crystals of the Bi-2223 single-phase.

Accordingly, there has been practiced a process of adding Pb to the bismuth-based high temperature superconductor to substitute Pb for a portion of the Bi content, and turning a superconductive phase into a $(Bi, Pb)_2 Sr_2Ca_2Cu_3O_z$ composition (that is, the Bi/Pb-2223), thereby facilitating the superconductive phase to be turned into a single phase in order to enhance properties of the superconductor described above.

In preparing the Bi/Pb-2223, there has been applied the "solid-state reaction process" whereby a starting material composed of powders of raw materials mixed at a non-stoichiometric ratio is sintered (a sintering temperature: on the order of 850° C.) in the atmosphere (refer to, for example, "Material Research Bulletin", 31 (1996), p. 979). However, it is to be pointed out that the reaction process requires a lot of time (on the order of 100 hours or longer), and the Bi/Pb-2223 purity of the final product prepared by such means as described has failed to exceed 96%.

This is because the process inevitably had to be started from mixed powders of raw materials blended at a non-stoichiometric ratio, so that elements not subjected to reaction as well as elements not evaporated remained as impurities, and the reaction to form the Bi/Pb-2223 via the Bi-2212 phase, which is a non-superconductive phase, did not fully proceeds, thereby leaving out a portion of the Bi-2212 between phases.

Thus, since it has been extremely difficult to obtain crystals of the Bi-2223 single-phase according to conventional techniques, there has been practiced a process of adding Pb to a bismuth-based high temperature superconductor, and turning a superconductive phase into Bi/Pb-2223, thereby facilitating the bismuth-based high temperature superconductor to be turned into a single phase. Nevertheless, it has still been difficult to turn the bismuth-based high temperature superconductor fully into a single phase, and in addition, it has taken considerable time to prepare the superconductor.

However, in order to enhance the superconductive properties of the bismuth-based high temperature superconductor (for example, in order to increase a critical temperature Tc thereof), it is considered a very important subject to cause the bismuth-based high temperature superconductor to "turn into a single-phase" wherein a second phase which is a non-superconductive insulating substance is not allowed to reside.

Further, an attempt has so far been made to turn the bismuth-based high temperature superconductor into a single-phase of the superconductive phase by adding Pb to the bismuth-based high temperature superconductor. However, Pb is a toxic element and, as such, is a raw material of which it is preferable to refrain from using as much as possible. In addition, among superconductors having an identical performance, a superconductor composed of varieties less in the number of raw materials, even by one, is evidently desirable, and consequently, even from this point of view, it is quite significant to remove Pb from the bismuth-based high temperature superconductor composed of a relatively large number of elements.

Further, in a bismuth-based high temperature superconductor, Pb is an element affecting not only stabilization of the 2223 phase but also electrical and magnetic properties thereof. For example, it is known that, with a complex copper oxide-based superconductor of a lamellar structure, such as a bismuth-based high temperature superconductor, conductivity in a direction perpendicular to a main conductive face thereof has profound effects on the most important properties of superconductive materials such as a critical magnetic field, and a critical current, and Pb exerts effects corresponding to its content on the conductivity in a direction perpendicular to the main conductive face.

Accordingly, if means for preparing easily and stably varieties of bismuth-based high temperature superconductors with a Pb content varying in a range of from 0 to a variety of values can be established, this makes it possible to implement preparation of bismuth-based high temperature superconductors having variously controlled properties, thereby largely contributing to progress in research on physical properties thereof and expansion in application thereof. Even for such reasons, it has been considered essential to develop means for easily preparing the crystals of the Bi-2223 single-phase, not containing Pb.

SUMMARY OF THE INVENTION

Under the circumstances described, it is therefore an object of the invention to provide means for efficiently and stably preparing a bismuth-based high temperature superconductor of a Bi-2223 single-phase and a bismuth-based high temperature superconductor of a Bi/Pb-2223 single-phase, wherein a second phase which is a non-superconductive insulating substance is not allowed to reside.

To this end, the inventors have carried out intensive studies particularly in realization that, from the viewpoint of obtaining crystals of the 2223 single-phase, wherein a second phase which is a non-superconductive insulating substance is not allowed to reside, it is important to develop a process of preparing a bismuth-based high temperature superconductor whereby the crystals of the 2223 single-phase can be obtained without going through an intermediate product phase (the 2212 phase) which is prone to remain, even in a final target product.

As a result, there has been acquired the knowledge that by use of oxides, carbonates, and so forth, containing Bi, Sr, Ca, and Cu, or Bi, Pb, Sr, Ca, and Cu, respectively, as raw materials for growing, which are mixed such that a constituent ratio of Bi Sr:Ca Cu or (Bi, Pb):Sr:Ca:Cu becomes "2:2:2:3", identical to the compositional ratio of the crystals of the 2223 single-phase as the target, and by adding thereto KCl as a flux before growing, crystals of Bi. 2223 or Bi/Pb-2223, hardly containing nonreactive residues, are stably prepared at a baking temperature lower than that for the conventional solid-state reaction process, and even in a shorter time.

The invention has been developed on the basis of items of the knowledge described above, and so forth, and provides a method of preparing a bismuth-based high temperature superconductor, as shown under items (1) to (4) given below.

(1) A method of preparing a bismuth-based high temperature superconductor of a chemical composition represented by $(Bi, Pb)_2 Sr_2Ca_2Cu_3O_z$, wherein mixed powders of raw materials, obtained by mixing the raw materials such that a mixing ratio of constituents, (Bi, Pb):Sr: Ca:Cu, becomes identical to a stoichiometric ratio of a crystal of the superconductor $(Bi, Pb)_2 Sr_2Ca_2Cu_3O_z$, are used as raw materials for sintering and grown using KCl as a flux.

(2) A method of preparing a bismuth-based high temperature superconductor of a chemical composition represented by $Bi_2Sr_2Ca_2Cu_3O_z$, not containing Pb, wherein mixed powders of raw materials, obtained by mixing the raw materials such that a mixing ratio of constituents, Bi:Sr:Ca:Cu, becomes identical to a stoichiometric ratio of a crystal of the superconductor $Bi_2Sr_2Ca_2Cu_3O_z$, are used as raw materials for sintering and grown using KCl as a flux.

(3) A method of preparing a bismuth-based high temperature superconductor as set forth under item (1) or item (2) above, wherein the mixed powders of the raw materials, obtained by mixing oxides and carbonates at a predetermined mixing ratio before calcination, are used as the raw material for the sintering.

(4) A method of preparing a bismuth-based high temperature superconductor as set forth under any of items (1) to (3) above, wherein the sintering is conducted at a sintering temperature kept at a constant level.

Oxides, carbonates, and so froth, ($Bi_2O_3$, $SrCO_3$, $CaCO_3$, CuO, PbO, and so forth) containing Bi, Sr, Ca, Cu, and Pb, the same as those used in a conventional method of preparing a bismuth-based high temperature superconductor through solid-state reaction, can be cited as the raw materials used in carrying out the method according to the invention.

However, a mixing ratio of the raw materials differs from that for the conventional method of preparing the bismuth-based high temperature superconductor through a solid-state reaction, and is adjusted such that a ratio of constituents, Bi:Sr:Ca Cu, or (Bi, Pb):Sr:Ca:Cu becomes "2:2:2:3", identical to the compositional ratio of the crystals of the 2223 phase as the target.

In this connection, in the case of using a Pb-containing raw material, there is a concern about a possibility of Pb, having a low vapor pressure, evaporating during the sintering, thereby failing to hit the compositional ratio thereof as intended. However, with the method according to the invention, the crystals of the 2223 phase as the target can be formed, even if the sintering temperature is lowered, and consequently, the sintering temperature can be rendered on the order of 15 to 20"C. lower than t hat (on the order of 865 to 875° C.) for the conventional method, thereby enabling variations in the Pb content to be suppressed. Further, variations in the Pb content can also be suppressed by putting a lid on a chemical reactor (a reaction vessel such as a crucible, and so forth) during the sintering.

Certainly, blending may be made such that the raw material has a higher Pb content to a degree, allowing for the amount of Pb evaporated during the sintering, however, from the viewpoint of environment problems, and so forth, evaporation of Pb needs to be restrained as much as possible.

Now, with the method according to the invention, it is recommended to calcinate the mixed powders of the raw materials, obtained by mixing to a predetermined compositional ratio thereof before sintering. This is because a precursor homogenized and having a nucleus of a crystal of the 2223 phase is formed by calcinating the mixed powders, and consequently, when the precursor is subjected to growing, the crystals of the 2223 phase undergo outstandingly rapid growth on the basis of the nucleus described above as compared with growth of other phases, thereby leading to stable formation of the crystals of the 2223 single-phase.

Calcination of the mixed powders of the raw materials is preferably carried out at a temperature in a range of on the order of 780 to 880° C. about two or three times by raising the temperature by stages. In the case of using the Pb-containing raw material for sintering, it can be said that the calcination may be carried out at a temperature lower than that for the raw material for sintering, not containing Pb, and even if such calcination is executed just once, pronounced advantageous effects are obtained.

Further, the method according to the invention features the use of KCl as a flux when sintering the mixed powders of the raw materials (including the precursor obtained by the calcination of the same).

KCl flux is a substance which considerably accelerates a reaction process, and greatly contributes to directly obtaining crystal of the 2223 phase in short time. Accordingly, by preparing the mixed powders of the raw materials through mixing of the raw materials such that a constituent element ratio thereof becomes identical to the composition ratio of the 2223 phase, and by adding thereto the KCl flux upon sintering, the crystals of the 2223 phase hardly containing nonreactive residues can be stably prepared.

In this case, if the precursor having the nucleus of the crystal of the 2223 phase is prepared by calcinating the mixed powders of the raw materials, and then a growing process is carried out, this will make it possible to prepare the crystal of the 2223 phase more rapidly and stably.

There is no need of strictly specifying an amount of the KCl flux to be used because it is dispersed out of a system during the growing process. Even in case of a portion thereof being left out, the same can be easily removed by washing with water.

Further, with the method according to the invention, the growing process for obtaining the crystal of the 2223 phase can be carried out at a temperature 15 to 20° C. lower than that in the case of the conventional solid-state reaction process for obtaining the bismuth-based high temperature superconductor (wherein there has been adopted a temperature in a range of about 865 to 875° C. in the case of using a Pb-bearing raw material, and a temperature in a range of about 885 to 895° C. in the case of using a raw material not containing Pb).

Still further, with the method according to the invention, it is possible to obtain the crystal of the 2223 phase even by shortening a sintering time to the order of 15 hours. However, it can be said that a sintering time is preferably set in a range of 15 to 100 hours, depending on a grain size as desired, and taking into account production efficiency because the longer the sintering time is, the larger the size of a single crystal as obtained becomes.

It is further to be pointed out that the growing process is preferably carried out at a temperature kept at a constant level where the 2223 phase is stably formed, strictly refraining from providing a temperature gradient during the growing process, and providing variations in temperature other than the temperature at the constant level within the sintering time. The reason for this is because if the temperature gradient and the variations in temperature are provided, this will raise a possibility of phases other than the 2223 phase as the target being introduced, thereby inviting degradation in the performance of a superconductor prepared.

A workpiece after completion of the sintering process may be left to cool down to room temperature by itself.

DESCRIPTION OF THE PREFERRED EMBODIMENTS

Preferred embodiments of a method of preparing a bismuth-based high temperature superconductor according to the invention are cited as follows.

A process considered as a preferable one comprises a step of mixing oxides and carbonates of Bi, Pb, Sr, Ca, and Cu, respectively, as raw materials for sintering, with each other such that a composition ratio of thereof, namely, a ratio of Bi:Sr:Ca:Cu or (Bi, Pb):Sr:Ca:Cu becomes "2:2:2:3", a step of calcinating the mixture thus obtained at a temperature in a range of about 780 to 88° C. on the order of two or three times for homogenization and nucleation of a 2223 phase, thereby forming a precursor, and a step of calcinating the precursor added with KCl as a flux at a sintering temperature, 15 to 20° C. lower than the temperature for the conventional solid-state reaction process, for a duration of 15 to about 100 hours before cooling the same down to room temperature. By use of such a process, it becomes possible to stably prepare the bismuth-based high temperature superconductor made up of crystals of a Bi-2223 or Bi/Pb-2223, wherein there hardly exist nonreactive residues.

EMBODIMENTS

Respective embodiments of the invention will be described in more detail hereinafter.

Example 1

With the present embodiment, tests to prepare crystals of a Bi-2223 phase not containing Pb were conducted as follows.

First, respective raw materials, namely, $Bi_2O_3$, $SrCO_3$, $CaCO_3$, and $CuO$, were mixed with each other such that a stoichiometric ratio of Bi:Sr:Ca:Cu came to be at 2:2:2:3, and homogeneous mixed powders (turned into nitrate) were thereby prepared by the spray-dry method using diluted nitric acid.

Next, while repeating pulverization whereby the mixed powders as agglomerated halfway through processing were crushed in a mortar, the mixed powders were calcinated in the air at three stages of 800° C., 860° C., and 880° C., and a precursor was thereby prepared.

Subsequently, powders of the precursor mixed with KCl at a weight ratio of "1:4" were charged into MgO crucibles, and mixtures were melted by heating at a constant temperature of 870° C. without providing a temperature gradient. In this case, two different sintering times, 15 hours and 100 hours, respectively, were adopted.

After completion of the sintering, specimens were left in the crucibles to cool down to room temperature by themselves.

Figure 1:
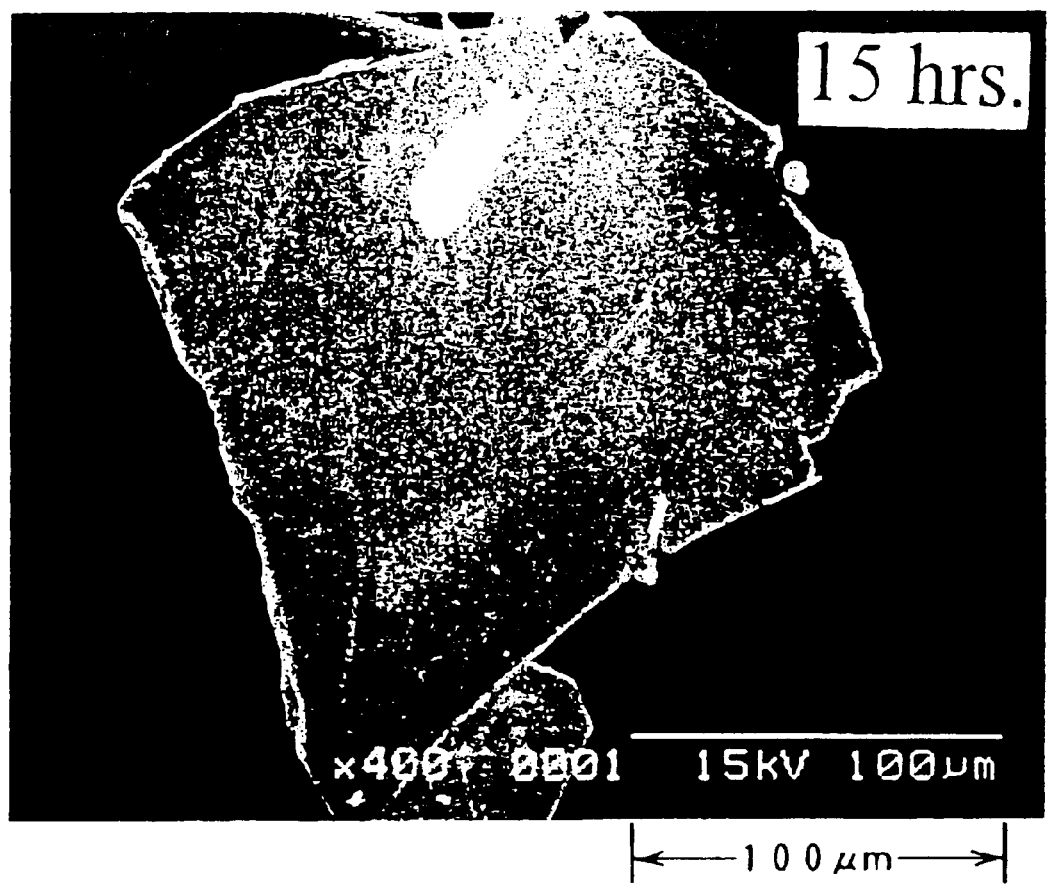
FIG. 1 is a scanning electron microscope (SEM) photomicrograph of a crystal of a Bi-2223 phase, prepared by Example 1 of the invention (sintering time 15 hours)
Figure 2:
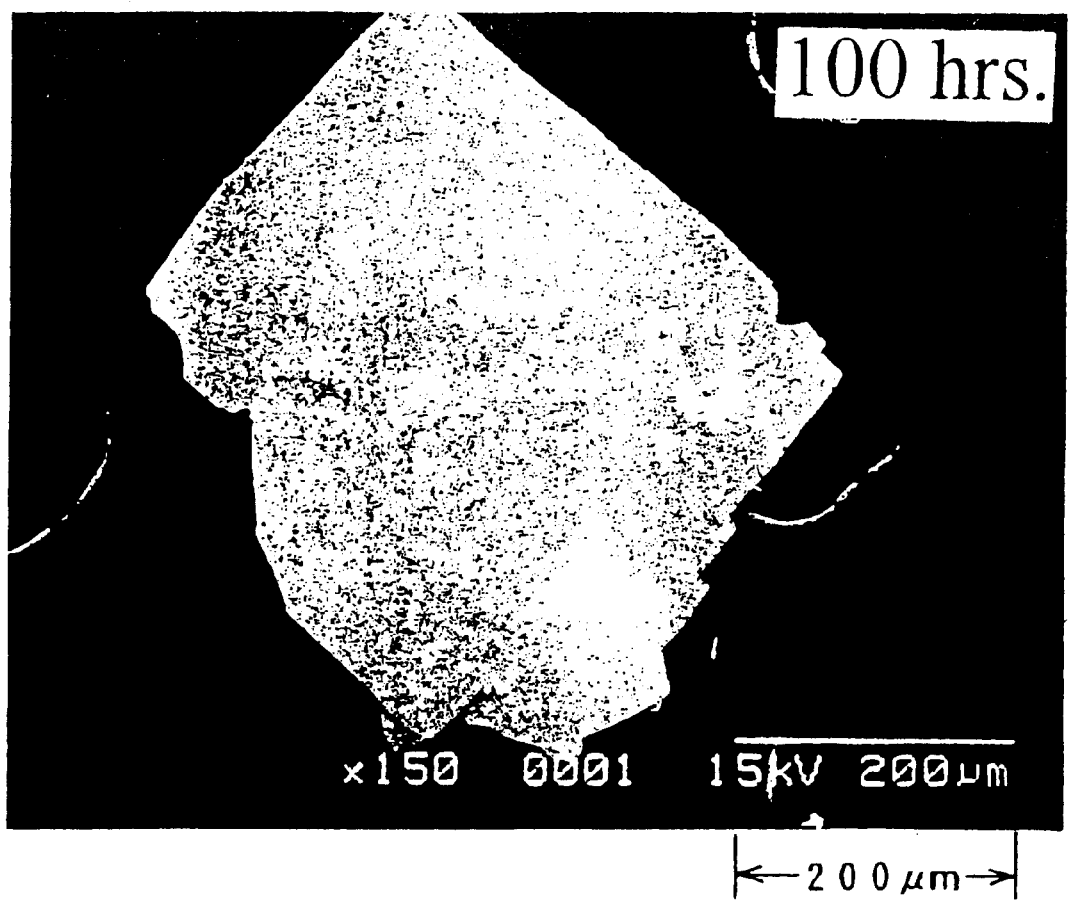
FIG. 2 is a SEM photomicrograph of a crystal of a Bi-2223 phase, prepared by Example 1 of the invention (sintering time: 100 hours)

A baked product as cooled down in the respective crucibles was taken out to be observed by a scanning electron microscope, whereupon a crystal shown in a micrograph of FIGS. 1 and 2, respectively, was recognized.

FIG. 1 shows a crystal product as obtained by sintering for a duration of 15 hours, and FIG. 2 shows a crystal product as obtained by sintering for a duration of 100 hours.

Figure 3:
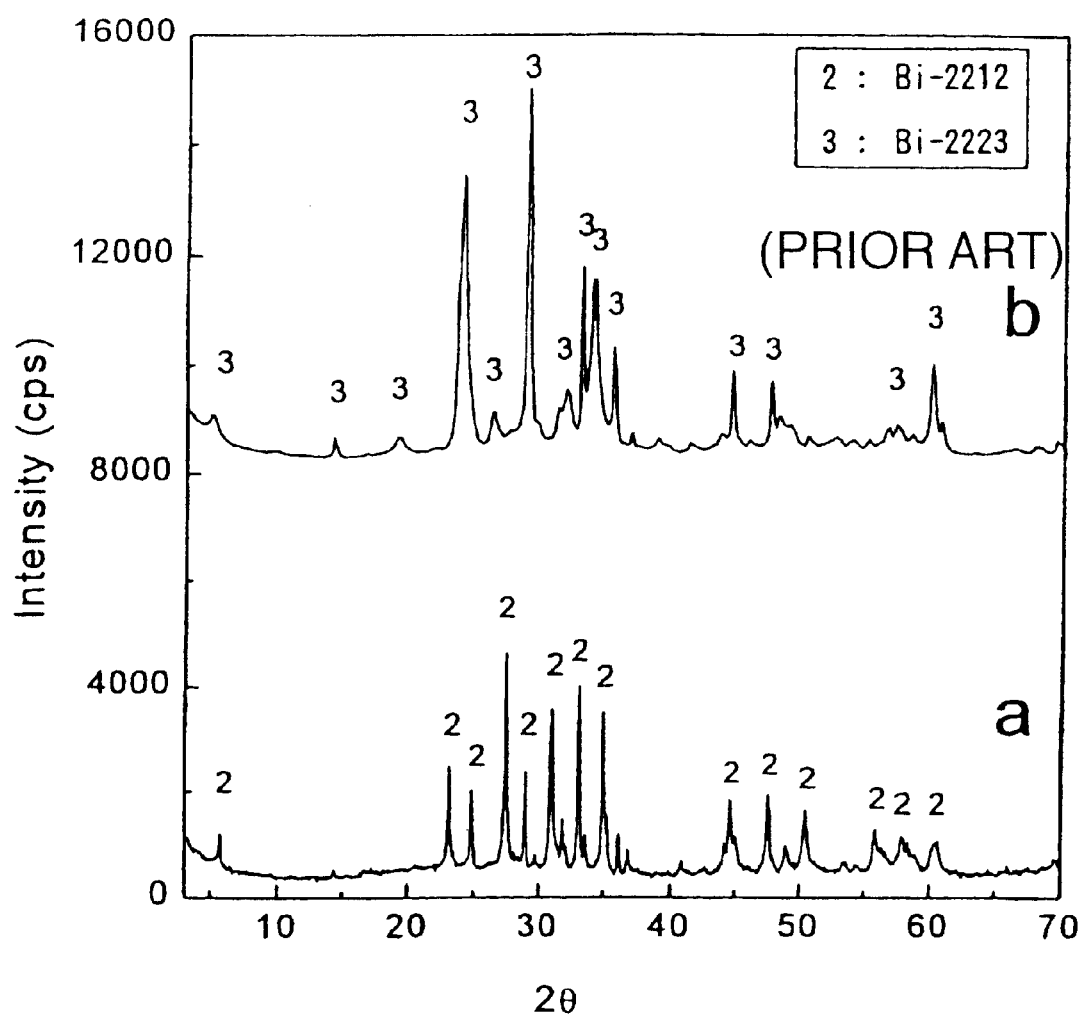
FIG. 3 is a graph showing a X-ray diffraction pattern of the crystal obtained by Example 1 of the invention (a), and a X-ray diffraction pattern of a sintered product prepared by a conventional solid-state reaction process (b)

Further, X-ray diffraction patterns of the crystals obtained as above were checked, and the X-ray diffraction patterns were found to be as shown in FIG. 3 (a), confirming that the crystals was a nearly perfect single crystal of a Bi-2223 phase without containing any impurity phase.

Results of the tests, shown in FIGS. 1, 2, and 3, demonstrate that the crystals of the single Bi-2223 phase, satisfactory enough for use in production of superconductive wires, can be obtained after a sintering time on the order of 15 hours according to the method of the invention, and further, single crystals in sizes as large as 400 $\mu$m square can be obtained by lengthening the sintering time to on the order of 100 hours.

Also, it was confirmed that grains of the crystals were quite anisotropically flat in shape, and as such, were in a very advantageous shape in the case where the crystals need to be oriented during a process of producing superconducting wires (a rolling process and so forth).

In FIG. 3, a X-ray diffraction pattern of a sintered product prepared from a starting material of the same kind by means of the conventional solid-state reaction process is also shown as (b) in the figure for the sake of comparison.

The conventional method was carried out under process conditions wherein "respective raw materials, namely, $Bi_2O_3$, $SrCO_3$, $CaCO_3$, and CuO were mixed with each other such that a stoichiometric ratio of Bi:Sr:Ca: Cu came to be at 2:2:2:3, homogeneous mixed powders were thereby prepared by the spray-dry method using diluted nitric acid, and the mixed powders were charged into MgO crucibles to be melted at a 885° C. for a duration of 110 hours before being left in the crucibles to cool down to room temperature by themselves".

The X-ray diffraction pattern as shown in FIG. 3(b) indicates that most of the sintered products prepared by means of the conventional solid-state reaction process remained as the Bi-2212 phase, and crystals of the Bi-2223 phase having superconductivity were not obtained.

Figure 4:
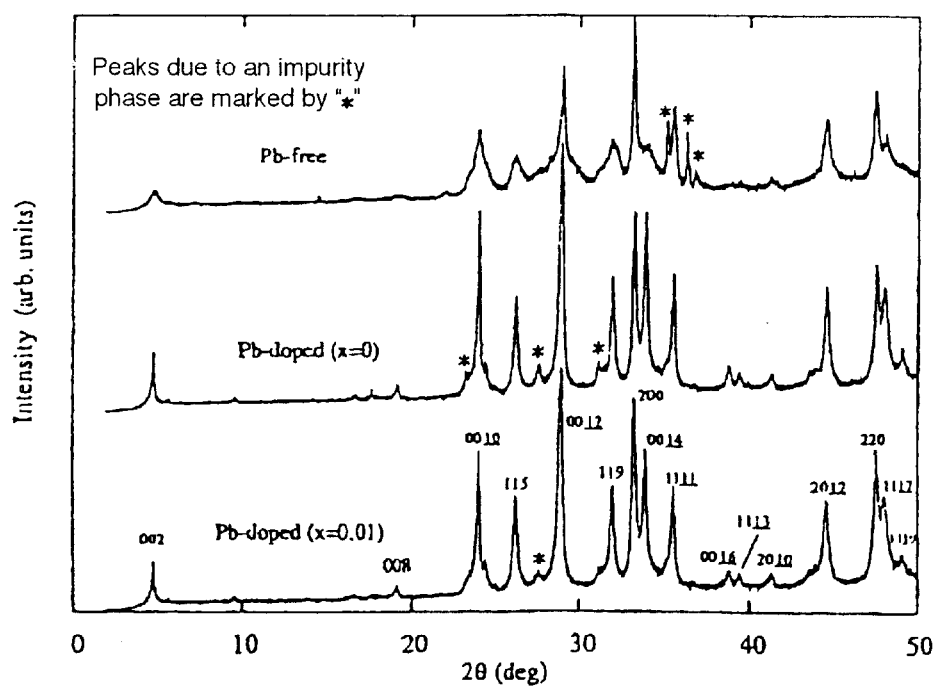
FIG. 4 is a graph showing X-ray diffraction patterns of specimens of a Bi-2223 phase as well as a Bi/Pb-2223 phase of relatively high-purity among those so far reported by way of example.

Further, FIG. 4 is also introduced herein for the sake of comparison, showing "the results of X-ray diffraction of specimens of the Bi-2223 phase as well as the Bi/Pb-2223 phase of relatively high-purity (on the order of 90%)" (as described in "Jpn. J. Appl. Phys.", 35 (1996), p. 2619). The specimens were prepared by use of the raw materials mixed at a compositional ratio deviating from the stoichiometric ratio. It is evident, even on the basis of the results of X-ray diffraction, introduced in FIG. 4, that crystals of a Bi-2223 phase of extreme high-purity, never obtained before, can be obtained by the method according to the invention.

Subsequently, "magnetization characteristic" and "temperature dependency of electric resistance" were examined with respect to the crystals of the Bi-2223 phase as obtained by baking the raw materials for 15 hours according to the present embodiment.

In examining the magnetization characteristic, "clusters of grains" formed by gathering up a plurality of single crystal grains of the Bi-2223 phase were used as objects for measurement in order to facilitate measurement of magnetic susceptibility by increasing the volume of the objects.

Then, in examining the temperature dependency of electric resistance, single crystals of the Bi-2223 phase, obtained by growing, were heat treated at 500° C. in the air, and were subjected to measurement of electric resistance.

Figure 5:
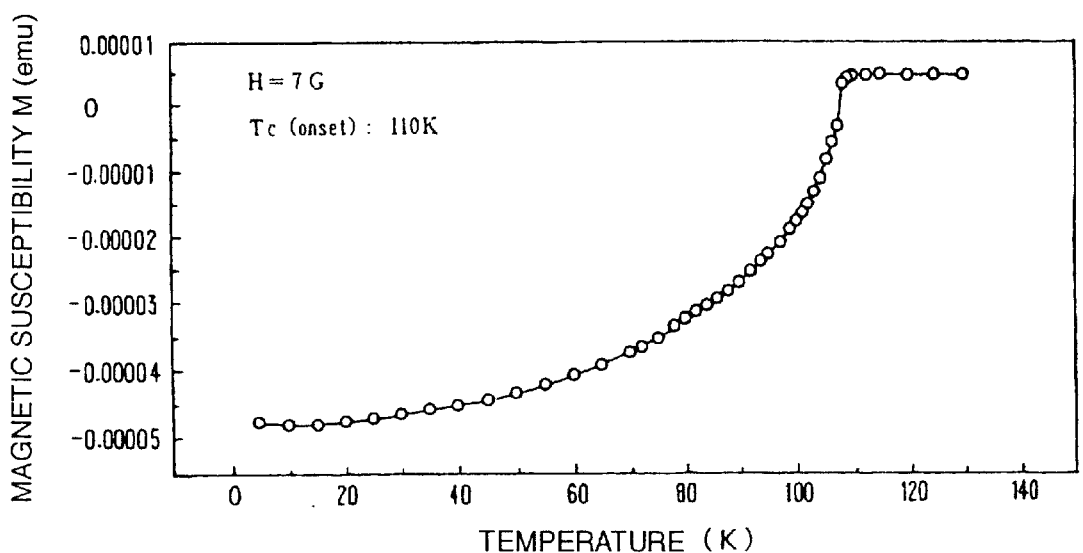
FIG. 5 is a graph showing examination results on "magnetization characteristic" of the crystal of the Bi-2223 phase, prepared by Example 1 of the invention.
Figure 6:
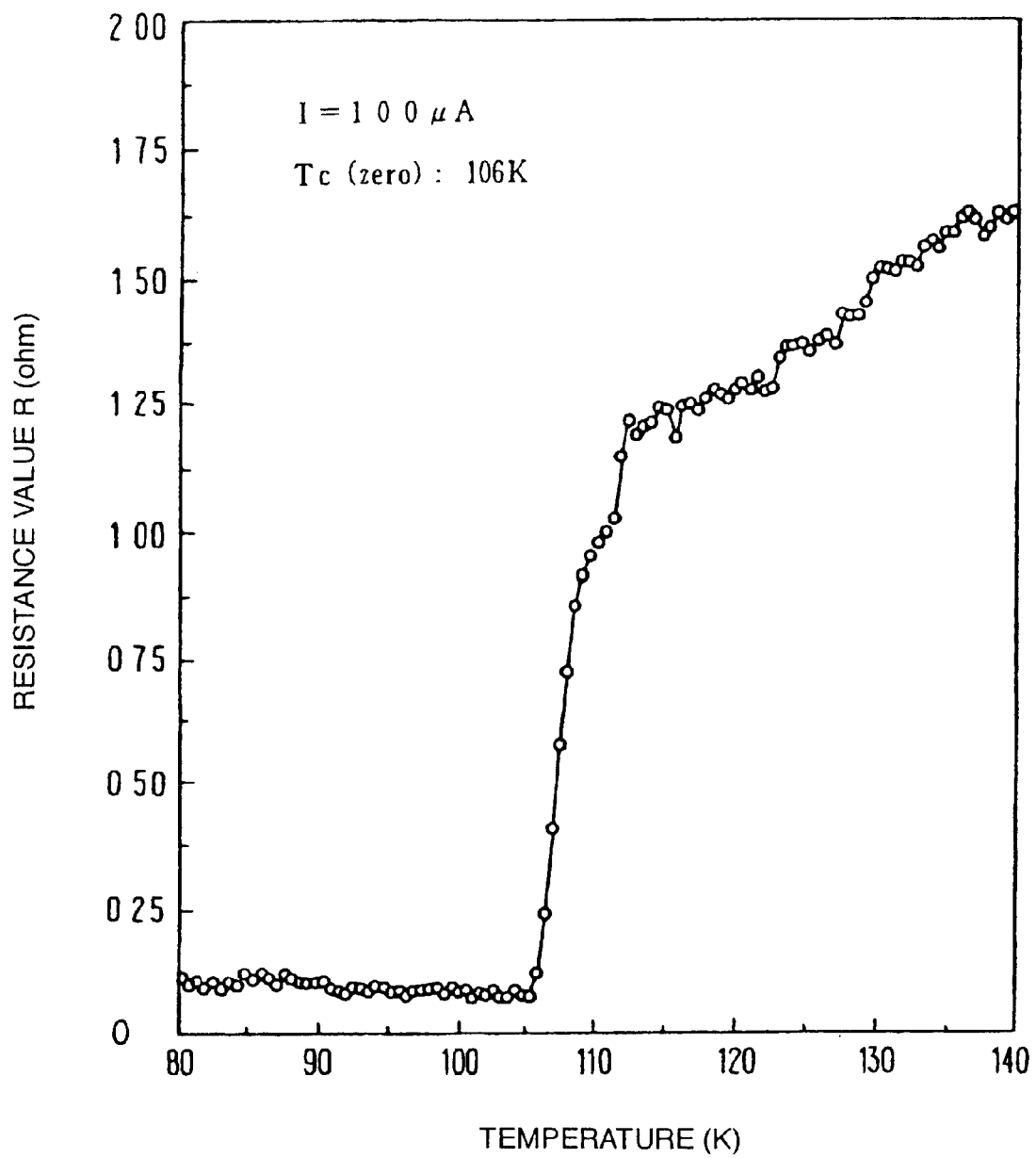
FIG. 6 a graph showing examination results on "temperature dependency of electric resistance" of the crystal of the Bi-2223 phase, prepared by Example 1 of the invention.

Examination results of the "magnetization characteristic" described above are shown in FIG. 5, and examination results of the "temperature dependency of electric resistance" are shown in FIG. 6.

As is evident from the examination results shown in FIGS. 5 and 6, respectively, it can be confirmed that both the magnetic susceptibility and the electric resistance indicates sharp transition to a superconducting state at a temperature in a range of 106 to 110 K, demonstrating that the crystal of the Bi-2223 phase, prepared by Example 1 of the invention, has sufficient excellent characteristics as a superconductor.

Example 2

According to the present embodiment, tests to prepare crystals of a Bi/Pb-2223 phase with Pb added thereto were conducted as follows.

First, respective raw materials, namely, $Bi_2O_3$, PbO, $SrCO_3$, $CaCO_3$, and CuO were mixed with each other such that a stoichiometric ratio of (Bi, Pb):Sr:Ca:Cu becomes 2:2:2:3, and a stoichiometric ratio of Bi Pb becomes 1.7:0.3, thereby preparing homogeneous mixed powders by the spray-dry method using diluted nitric acid.

Next, while repeating pulverization whereby the mixed powders as agglomerated halfway through processing were crushed in a mortar, the mixed powders described above were calcinated in the air in two stages at 780° C. and 800° C., respectively, (calcinated in MgO crucibles, each provided with a lid,) thereby preparing a precursor.

Subsequently, powders of the precursor mixed with KCl at a weight ratio of "1:4" were charged into the MgO crucibles, a lid was put on the respective MgO crucibles, and mixtures were heated at a constant temperature of 855° C. without providing a temperature gradient. In this case, a sintering time of 20 hours was adopted. After completion of sintering, the products were left in the crucibles to cool down to room temperature by themselves.

The sintered product as cooled down in the respective crucibles was taken out, and observed by a scanning electron microscope, whereupon it was confirmed that a multitude of single crystals with an average size of 250 $\mu$m square were formed.

Further, as a result of examination of these crystals by means of X-ray diffraction, it was confirmed that the crystals were a nearly perfect single crystals of a Bi/Pb-2223 phase containing few impurity phases (Bi/Pb-2223 purity: 97%).

Further, with reference to the single crystal of the Bi/Pb-2223 phase thus obtained, the ratio of Bi to Pb was examined, and it was found that the ratio came to be at 1.7:0.3 as intended.

The results as described above demonstrate that, with the use of the method according to the invention, it is possible to stably prepare high purity crystals of the Bi/Pb-2223 phase having a Pb content as intended at a relatively low sintering temperature and in a relatively short time.

As described hereinbefore, with the method according to the invention, it is possible to stably prepare the bismuth-based high temperature superconductor of the Bi-2223 single-phase and the bismuth-based high temperature superconductor of the Bi/Pb-2223 single phase, wherein a second phase which is a non-superconductive insulating substance is not allowed to reside, at low cost and efficiently. In addition, because the following advantageous effects can be anticipated, the method has very significant usefulness.

a) With the use of the bismuth-based high temperature superconductor prepared by the method according to the invention as a raw material for superconducting wires, it becomes possible to enhance the property of bismuth-based superconducting wires, allowing more current to flow therethrough.

b) With the application of the method according to the invention, a bismuth-based high temperature superconductor layer having excellent characteristics can be formed for use in a substrate material, thereby enabling new application areas of the bismuth-based high temperature superconductor such as application thereof to superconducting devices, and so forth, to be opened.

c) With the application of the method according to the invention, large sized single crystals of the bismuth-based high temperature superconductor can be prepared, thereby enabling new application areas using the single crystals of the bismuth-based high temperature superconductor to be developed.

d) With the application of the method according to the invention, a variety of Bi-2223 phases, including one containing no Pb, and ones having various Bi/Pb ratios, can be obtained, so that it becomes possible to provide the bismuth-based high temperature superconductors having various characteristics adapted to various application purposes.

What is claimed is:

1. A method of preparing a $Bi_2Sr_2Ca_2Cu_3O_z$ high temperature superconductor comprising the steps of: providing raw materials containing Bi, Sr, Ca and Cu; mixing the raw materials to form a mixture containing Bi, Sr, Ca and Cu in a constituent ratio Bi:Sr:Ca:Cu of 2:2:2:3, calcinating the mixture to form a precursor; mixing the precursor with KCl; and sintering the precursor with KCl to form single crystals of $Bi_2Sr_2Ca_2Cu_3O_z$.

2. The method of claim 1, wherein the raw materials are provided in the form of oxide and carbonate powders.

3. The method of claim 1, wherein the sintering is conducted at a constant temperature.

4. The method of claim 3, wherein the constant temperature is 870° C.

5. The method of claim 1, wherein the mixture is calcined in a temperature range of from 780–880° C.

6. The method of claim 1, wherein the precursor is mixed with KCl at a weight ratio of 1:4.

7. The method of claim 1, wherein the superconductor has a critical temperature in the range of from 106–110° K.

* * * * *